United States Patent [19]
Jeffries et al.

[11] Patent Number: 5,829,515
[45] Date of Patent: *Nov. 3, 1998

[54] HEAT DISSIPATOR WITH MULTIPLE THERMAL COOLING PATHS

[75] Inventors: John Jeffries, Marble Falls; Ray Wang, Austin, both of Tex.

[73] Assignee: Dell U.S.A., L.P., Round Rock, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 644,582

[22] Filed: May 10, 1996

[51] Int. Cl.⁶ ................ F28F 7/00; H05K 7/20
[52] U.S. Cl. .......... 165/80.3; 165/185; 174/16.3; 257/718; 361/687; 361/704; 361/715; 361/720
[58] Field of Search .................. 165/80.3, 185; 257/718, 722; 361/704, 707, 687, 690, 710, 715, 719, 720; 174/16.3

[56] References Cited

U.S. PATENT DOCUMENTS

| | | |
|---|---|---|
| 4,400,858 | 8/1983 | Goiffon et al. ............ 361/704 X |
| 4,408,220 | 10/1983 | Calabro ................ 165/80.3 X |
| 5,201,866 | 4/1993 | Mok .................... 165/80.3 |
| 5,351,176 | 9/1994 | Smith et al. . |
| 5,353,863 | 10/1994 | Yu ..................... 165/80.3 |
| 5,411,077 | 5/1995 | Tousignant . |
| 5,422,787 | 6/1995 | Gourdine . |
| 5,430,609 | 7/1995 | Kikinis ................. 361/687 |

FOREIGN PATENT DOCUMENTS

| | | | |
|---|---|---|---|
| 48797 | 9/1991 | Japan ................ 361/720 |
| 364095 | 12/1992 | Japan ................ 361/720 |
| 315777 | 11/1993 | Japan ................ 361/720 |

OTHER PUBLICATIONS

Author unknown, "Flexible Shell Conduction/Convection Cooling Device", Research Disclosure, May 1986, No.265.
Author Unknown, "Spring–Loaded Heat Sinks For VLSI Packages,"Research Disclosure, Oct. 1990, No. 318.

*Primary Examiner*—Leonard R. Leo
*Attorney, Agent, or Firm*—Haynes and Boone, L.L.P.

[57] ABSTRACT

A technique for dissipating heat generated by a chip in a small, inexpensive, quiet, and reliable manner without drawing power from a power source. In a preferred embodiment, the chip resides in a computer housing and a heat dissipator for the chip is made up of a convection component and a conduction component. The convection component is similar to a conventional heat sink. It includes fins that channel a flow of air therethrough releasing heat into the air. The conduction component is a thermal conductor which attaches to a heat spreader. In the preferred embodiment, the heat spreader is part of the computer housing.

9 Claims, 2 Drawing Sheets

HEAT DISSIPATOR WITH MULTIPLE THERMAL COOLING PATHS

TECHNICAL FIELD

The invention relates generally to the field of heat transfer and, more particularly, to a method and apparatus for cooling a component of an electronic device such as a computer by providing multiple paths for heat to dissipate.

BACKGROUND OF THE INVENTION

Semiconductor integrated circuit devices, or "chips", are advancing in many ways. For example, many chips, as used in computers, are seeing an increase in operating speed, overall size, and number of transistors. These advancements, while creating smaller and faster electronic circuits, result in increased power consumption and heat generation inside the chip. Many such chips consume more than 30 watts of power and therefore create a very large amount of heat.

The detrimental effects of excessive heat inside a chip such as reduction of the extended life and reliability of the chip are well known in the art. As a result, designers of computers and other electronic circuits have utilized various techniques to remove, or dissipate, heat from a chip or electronic circuit. Two such techniques involve heat convection and conduction. An example of conduction is a heat spreader thermally coupled to the chip. Heat flows from the chip to the heat spreader. The heat spreader is sufficiently large so that it can receive a large amount of heat from the chip and so that it can efficiently radiate the heat, thereby cooling the chip. An example of convection is a heat sink thermally coupled to the chip, combined with a moving air mass. Heat flows from the chip to the heat sink, and as the air mass moves across the surface of the heat sink, heat is transferred to the air mass, where it is carried away from the heat sink and the attached chip.

Ideally, computer designers desire chips that can be sufficiently cooled by natural convection alone. Natural convection, which is the normal movement of air mass and typically less than 100 linear feet per minute ("LFPM"), does not require a fan. In actuality, most chips can operate with natural convection in combination with a conventional, passive heat sink. For example, some processors can operate at a maximum clock rate of 100 MHz with only a conventional heat sink and natural convection. However, processors operating at a clock rate above 100 MHz require more elaborate means for heat dissipation.

Chips such as the processors described above are typically located in a housing, such as a computer housing, which further exacerbates the problem of heat dissipation. This is because many computer housings are relatively small and have at most one fan with which to convey an air mass. As a result, the size of the air mass inside the housing is significantly reduced, and the quantity of chips and other electronic circuits located inside the computer housing combine to raise the temperature of the air mass to damaging levels. Designers of computers, however, are extremely reluctant to increase the size of the computer housing or to include more fans. Instead of providing larger spaces and more fans, most computer designers strive to have smaller computer housings and smaller, quieter fans with which to cool them.

As a result, many elaborate attempts have been made with which to meet the heat dissipation requirements of the chips inside the computer, while meeting the overall downsizing goals of computer housings and auxiliary fans. Such attempts include providing alternative cooling means, such as faster fans, or forced circulation of a cold fluid. Although these attempts do improve the heat dissipation, their increased size, cost, power consumption, reliability, and/or noise make the resulting computers undesirable to many consumers. Furthermore, for lap-top computers, the adverse impact on battery life, in addition to the above described limitations, would impose an entire new set of design challenges. Other attempts include elaborate, high technology heat sinks, such as those which include a liquid core or a plurality of coalesced fibers. While these high-technology heat sinks may be an improvement over the conventional heat sinks described above, their improvement in heat dissipation is marginal and their high cost make their usefulness limited in most computer applications.

Therefore, what is needed is a method and apparatus for dissipating the heat generated by a chip in a small, quiet, and reliable manner.

Furthermore, what is needed is a method and apparatus for dissipating the heat generated by faster chips, such as a 200 MHz PENTIUM processor, for example, without placing an additional burden on a power source.

Finally, what is needed is a method and apparatus for dissipating heat from a chip that is better than a conventional heat sink, but is still relatively inexpensive.

SUMMARY OF THE INVENTION

The present invention, accordingly, provides a technique for dissipating heat generated by a chip in a small, inexpensive, quiet, and reliable manner without drawing additional power from a power source. In a preferred embodiment, a heat dissipator is made up of a convection component and a conduction component. The convection component is similar to a conventional heat sink. The heat sink draws heat from the chip and includes fins that channel a flow of air therethrough so that the heat can be easily transferred into the air. The conduction component includes a thermal conductor attached between the chip and a heat spreader. In a typical application, the heat spreader is located inside a computer housing or is part of the housing.

A technical advantage achieved with the invention is that two separate and operably different cooling paths are provided for dissipating heat.

Another technical advantage achieved with the invention is that heat is dissipated from a chip in a quiet, and reliable manner.

Still another technical advantage achieved with the invention is that more heat is dissipated from a chip than with a conventional heat sink, in a relatively small and inexpensive manner.

DETAILED DESCRIPTION OF THE PREFERRED EMBODIMENT

All integrated circuits, or "chips", generate heat and are thereby susceptible to error or damage caused by overheating, as described above. For the sake of example, the Intel™ PENTIUM™ processor is one such chip but the present invention is applicable to all chips, as well as other heat producing circuits and devices.

Figure 1:
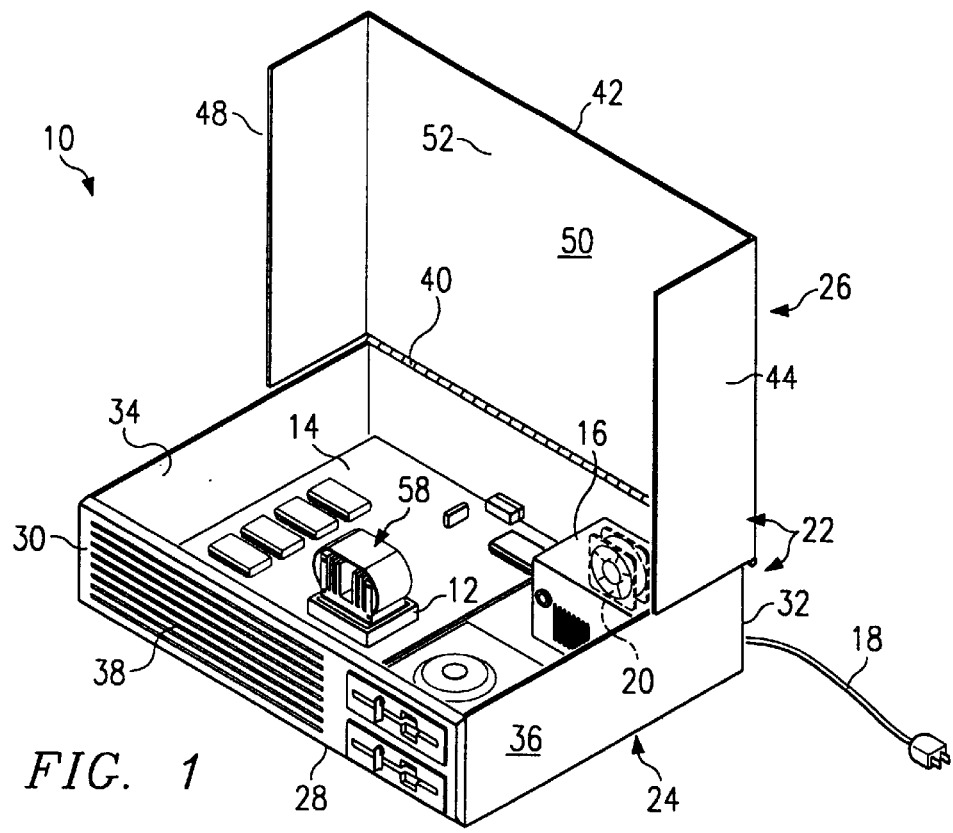
FIG. 1 is a diagram of a computer which uses the heat dissipator with multiple thermal cooling paths of the present invention.

Referring to FIG. 1, a desktop computer 10 comprises a plurality of components. These components include a chip 12 mounted on a circuit board 14, a power supply 16 attached to a power cable 18, and a fan 20. Although not shown, the desktop computer 10 includes many other components, including more circuit boards, disk drives and cables. The desktop computer 10 is configured to arrange all of the components in as small a space as possible, thereby making the computer relatively tight and compact.

A computer housing 22 is used to store the components and keep them protected from external contact. The computer housing 22 comprises a chassis 24 and a cover 26. The chassis 24 includes a bottom 28 and four side panels, the four side panels including a front 30, back 32, left 34, and right 36 panel. The bottom panel 28 and four side panels 30, 32, 34, 36 are constructed of a uniform, strong, insulating material to protect the components from any electrical or physical damage. The chassis 24 supports all of the components by allowing them to be attached to either a bottom panel 28 or one of the side panels 30–36. The fan 20 is attached to the back panel 32 and an air ingress port 38 is provided in the front panel 30. The circuit board 14 is attached between the left 34 and right 36 side panels so that the fan 20 can pull an air mass (not shown) across the circuit board 14.

The power supply 16 is attached to the bottom 28 and rear 32 panels and supplies power to the components of the computer. The configuration of the components inside the chassis 24 considers many factors known to those skilled in the art but outside the scope of the present invention. Regardless, the present invention can be readily adapted to most, if not all, configurations of the components inside the chassis 24.

The chassis 24 also includes a hinge 40 mounted on the back panel 32. The hinge 40 is used to attach the chassis 24 to the cover 26. The cover 26 includes a top panel 42 and two side panels 44 and 48. The top panel 42 includes two surfaces, an outer surface 50 and an inner surface 52. The outer surface 50 is constructed of a strong, plastic, insulating material. The inner surface 52 is constructed of a heat conductive material. The side panels 44–48 are constructed of a strong, plastic material, similar to the outer surface 50 of the top panel 42. The side panels 44, 48 of the cover 26 are spaced slightly larger than the side panels 34, 36 of the chassis 24 so that the side panels of the cover can be placed over and outside the side panels of the chassis. In this way, the cover 26 may be placed on top of the chassis 24, thereby placing the computer housing 22 in a closed, sealed position. Furthermore, the hinge 40 allows the cover 26 to be rotated away from the chassis 24 so that the components inside the chassis can be accessed or removed.

Figure 2:
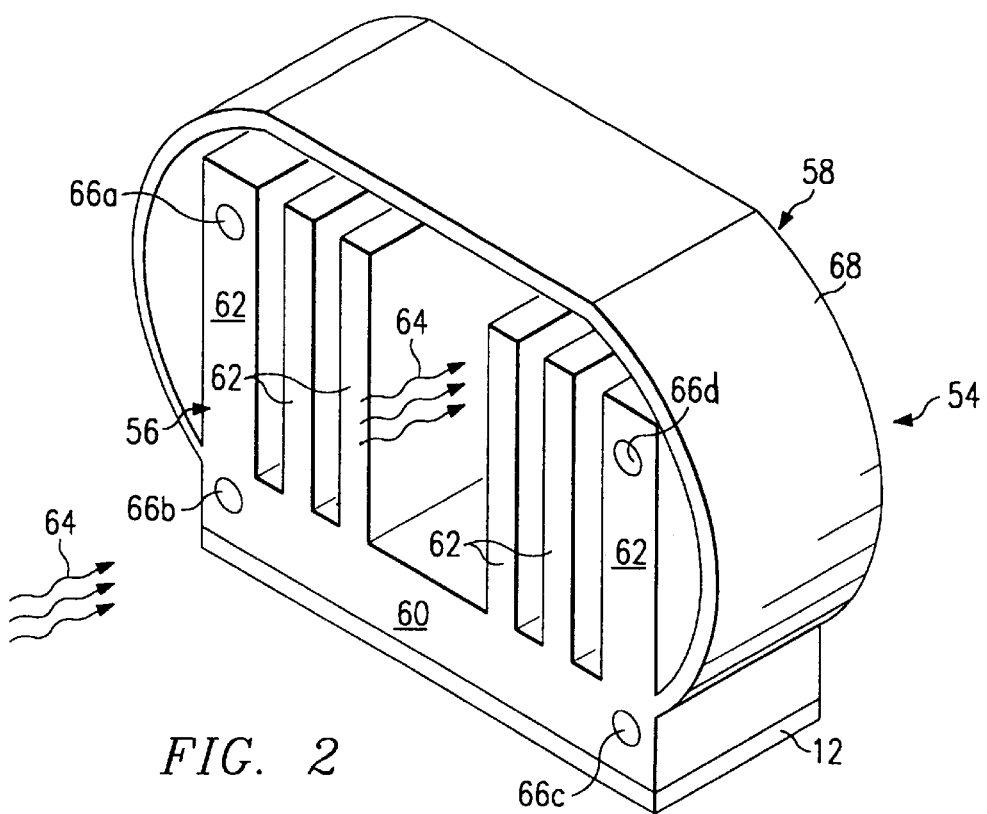
FIG. 2 is a first embodiment of the heat dissipator used in the computer of FIG. 1.

Referring also to FIG. 2, a multi-path heat dissipator, ("MPHD") 54, is conventionally attached to the chip 12 to allow thermal conduction of heat from the chip to the MPHD. Methods for attaching the heat sink to the chip 12, such as thermal grease, are well known in the art and will not be further discussed. The MPHD 54 can be subdivided into two separate components, a convection component 56 and a conduction component 58. The components 56, 58 are integrally formed in the present embodiment, although it is understood they may alternatively comprise separate but connected structures.

The convection component 56 resembles a conventional heat sink, is made of a heat conducting material, such as BeCu. It includes a base 60 and longitudinally extending parallel fins 62 which are positioned and spaced apart to provide an optimum amount of surface area from which heat can dissipate. The efficiency of the convection component 56 correlates directly with conventional heat sinks in that different amounts of heat can be dissipated, depending on the length, number, size and arrangement of the fins 62. In the preferred embodiment, there are six fins 62, each one inch in length, and arranged so that the air mass 64 flows between the fins, in the direction of the reference arrows. The configuration of the fins 62 can also be arranged to create the optimal air flow between and around the fins. The convection component 56 also includes four screw holes 66a, 66b, 66c, 66d so that an auxiliary fan (not shown) may be mounted directly to the MPHD 54. Although it is not anticipated that an auxiliary fan is necessary for the chip 12, the screw holes 66a–66d are provided in anticipation of different applications that require even greater heat dissipation.

The conduction component 58 comprises a large metal conductor 68. In the preferred embodiment, the conduction component 58 is made entirely of BeCu, although many different heat conducting materials may be used. The conduction component 58 attaches to one side of the base 60 of the MPHD 54, wraps around the fins 62, and reattaches to the opposite side of the base. The conduction component 58 is relatively wide so that it can conduct a large amount of heat from the chip 12. The conduction component 58 is also relatively tall so that when the computer housing 22 (FIG. 1) is in the closed position, the conduction component 58 is thermally connected with the inner surface 52 of the cover's top panel 42. In this manner, the inner surface 52 serves as a large heat spreader, with a great deal of surface area with which to spread heat.

Figure 3:
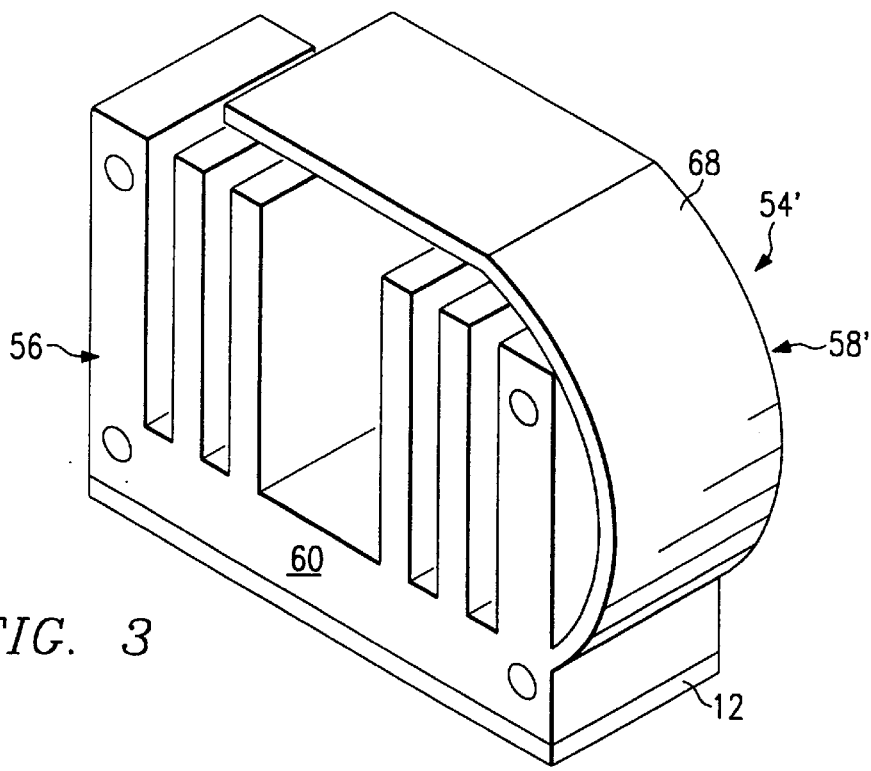
FIG. 3 is a second embodiment of the heat dissipator used in the computer of FIG. 1.

Referring to FIG. 3, an alternative embodiment of an MPHD, designated by the reference numeral 54', acts in a similar manner as the MPHD 54 of FIG. 2. However, the shape of the conduction component 58'is slightly different, which facilitates placing the chip 12 and MPHD 54' in an awkward location inside the chassis 24 (FIG. 1) that can not utilize the MPHD 54 of FIG. 2. Furthermore, FIGS. 2 and 3 are only representative of the many different shapes of convection and conduction components. Each alternative embodiment can be optimized for the location of the MPHD inside the housing 22 (FIG. 1), or for the operation of the housing itself. For example, a spring type conduction component may be utilized to work with a computer housing with a cover that slides on top of the chassis. Furthermore, the inner surface of the top panel 42 of the cover 26 may include ridges or other heat conductive surfaces to facilitate heat sinks that cannot easily reach the cover.

Figure 4:
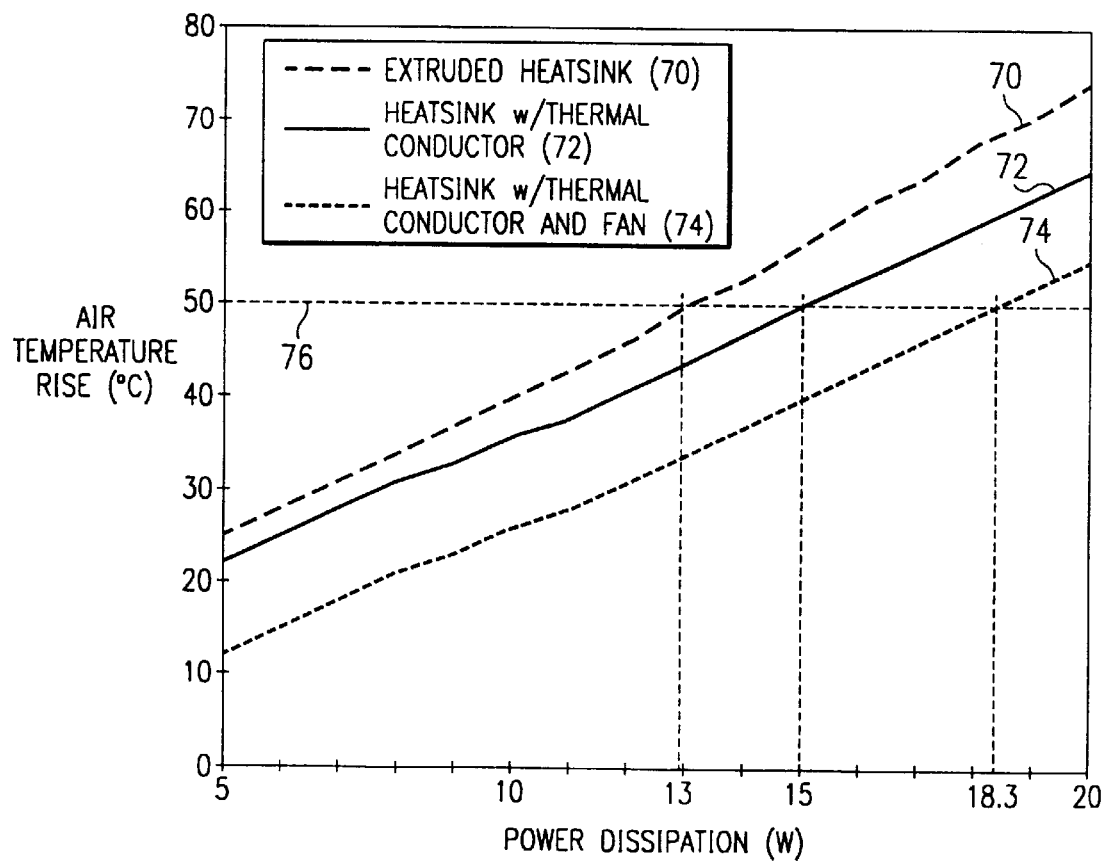
FIG. 4 is a graph showing air temperature rise vs. power dissipation with various heat dissipators.

Referring to the graph of FIG. 4, three scenarios are plotted with respect to a power dissipation axis and an air temperature rise axis. The first scenario 70 represents the thermal characteristics of a conventional heat sink with six one-inch fins and natural convection (air flow<100 LFPM). The second scenario 72 represents the thermal characteristics of the MPHD 54 (FIG. 2) and natural convection. The third scenario 74 represents the thermal characteristics of the MPHD 54 and the fan 20 (FIG. 1) producing an air flow of about 200 LFPM. For the sake of example, it will be assumed that ambient air temperature is 20° C. Intel requires that the case temperature of the chip 12 (a PENTIUM processor) be maintained below 70° C., and that the chip generates about 13.5 Watts at a 120 MHz clock rate (*Intel Pentium Processor Data Sheet*, p. 26, 1996).

Considering the maximum case temperature for the chip 12 (70° C.), minus the ambient air temperature (20° C.), our example reveals that there may only be a 50° C. air temperature rise (70° C.−20° C.=50° C.). Therefore, a reference line 76 crosses the Air Temperature Rise axis at 50° C.

The first scenario 70 (conventional heat sink) crosses the 50° C. reference line 76 at 13.0 Watts. This indicates that the conventional heat sink with natural convection is not a viable alternative for the chip 12 operating at 120 MHz. The second scenario 72 (MPHD) crosses the 50° C. reference line 76 at 15.0 Watts. This indicates that the MPHD 54 with natural convection is a viable alternative for the chip 12 operating at 120 MHz. Meanwhile, the third scenario 74 (MPHD and fan) crosses the 50° C. reference line 76 at 18.3 Watts. This indicates that the MPHD 54 and fan 20 is also a viable alternative for the chip 12 operating at 120 MHz.

The above described analysis is only part of a complete thermal analysis for determining the heat dissipation requirements of a chip inside a computer. A complete analysis must also consider the thermal resistances for the chip package, the laminar airflow actually flowing across the chip, and other factors. However, the above described analysis is an important part of the complete analysis and illustrates the heat dissipation benefits of the MPHD 54.

It is understood that the MPHD 54 can take many forms and embodiments, the embodiments shown herein are intended to illustrate rather than limit the invention, it being understood that variations may be made without departing from the spirit of the invention. Furthermore, the MPHD 54 may be utilized in applications other than computer or electronics applications. Accordingly, it is appropriate that the appended claims be construed broadly and in a manner consistent with the scope of the invention.

What is claimed is:

1. In a computer comprising a computer housing, a circuit board inside the housing, and a heat producing device on the circuit board, a multi-path heat dissipator comprising:
    a base portion thermally connected to the heat producing device;
    a plurality of fins connected to and extending from the base portion for convecting heat; and
    a thermal conductor connected to the base portion and extending above said plurality of fins in contact with a portion of the housing when the housing is in a closed position, for conducting heat from the base portion to the portion of the housing.

2. The multi-path heat dissipator of claim 1 wherein the thermal conductor is separated from the housing when the housing is in an open position.

3. The multi-path heat dissipator of claim 2 wherein the portion of the computer housing is a heat spreader.

4. The multi-path heat dissipator of claim 2 wherein each of the plurality of fins are affixed to a predetermined size and arrangement, thereby facilitating the fins ability to convect heat.

5. The multi-path heat dissipator of claim 1 further comprising:
    mounting means for securing and attaching an air-movement device to the dissipator.

6. The multi-path heat dissipator of claim 5 wherein the mounting means is integral with at least one of the plurality of fins.

7. The multi-path heat dissipator of claim 1 wherein substantially most of the heat convected through the fins is convected into air.

8. A computer comprising:
    a housing including a heat spreading portion capable of being in an open or closed position;
    a heat producing device mounted inside the housing; and
    a heat dissipator comprising:
        a base portion thermally connected to the heat producing device for conducting heat from the heat producing device;
        a plurality, of fins connected to and extending from the base portion for convecting a portion of the heat from the base into a surrounding fluid; and
        a conductor thermally connected to the base portion and extending above said plurality of fins in contact with the heat spreading portion of the housing when the housing is in the closed position for conducting another portion of the heat from the base portion to the heat conducting portion of the housing.

9. The computer of claim 8 wherein the thermal conductor is separated from the housing when the housing is in an open position.

* * * * *